(12) United States Patent
Tezuka et al.

(10) Patent No.: US 10,458,640 B2
(45) Date of Patent: Oct. 29, 2019

(54) VENTILATION AND HUMIDITY-CONDITIONING UNIT AND APPARATUS

(71) Applicant: NITTO DENKO CORPORATION, Ibaraki-shi, Osaka (JP)

(72) Inventors: Teppei Tezuka, Ibaraki (JP); Yuuzou Muraki, Ibaraki (JP); Kazuhiro Omura, Ibaraki (JP); Koji Furuuchi, Ibaraki (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 16/062,164

(22) PCT Filed: Dec. 12, 2016

(86) PCT No.: PCT/JP2016/086885
§ 371 (c)(1),
(2) Date: Jul. 12, 2018

(87) PCT Pub. No.: WO2017/104603
PCT Pub. Date: Jun. 22, 2017

(65) Prior Publication Data
US 2018/0328580 A1    Nov. 15, 2018

(30) Foreign Application Priority Data

Dec. 17, 2015    (JP) .................. 2015-246748

(51) Int. Cl.
*F21V 31/03*    (2006.01)
*H05K 5/06*    (2006.01)
(Continued)

(52) U.S. Cl.
CPC ............ *F21V 31/03* (2013.01); *B01D 53/261* (2013.01); *B01D 53/263* (2013.01);
(Continued)

(58) Field of Classification Search
None
See application file for complete search history.

(56) References Cited

U.S. PATENT DOCUMENTS

| | | | | | |
|---|---|---|---|---|---|
| 4,755,917 | A | * | 7/1988 | Bals ........................ | F21S 45/33 362/547 |
| 4,796,163 | A | * | 1/1989 | Dressler .................. | F21S 45/33 362/547 |

(Continued)

FOREIGN PATENT DOCUMENTS

| | | |
|---|---|---|
| CN | 104334406 A | 2/2015 |
| DE | 2234658 A1 | 2/1974 |

(Continued)

OTHER PUBLICATIONS

Jan. 24, 2017 International Search Report issued in International Application No. PCT/JP2016/086885.

(Continued)

*Primary Examiner* — Elmito Breval
(74) *Attorney, Agent, or Firm* — Oliff PLC (57) ABSTRACT

A holding member mounted to the case including the internal space, a holding member including the ventilation hole that provides ventilation between the internal space and the external space; a humidity-conditioning member provided midway in the ventilation hole of the holding member and absorbing water vapor; and a ventilation filter provided to the holding member, a ventilation filter being closer to the external space than the humidity-conditioning member is, a ventilation filter being permeable to a gas and preventing a liquid and a sold from entering the internal space.

8 Claims, 7 Drawing Sheets

(51) Int. Cl.
  *F21S 43/00*   (2018.01)
  *F21S 45/33*   (2018.01)
  *B60H 1/00*   (2006.01)
  *F21V 31/00*   (2006.01)
  *F21S 45/10*   (2018.01)
  *F21S 45/50*   (2018.01)
  *B01D 53/26*   (2006.01)

(52) U.S. Cl.
  CPC ....... *B01D 53/268* (2013.01); *B60H 1/00271* (2013.01); *F21S 43/00* (2018.01); *F21S 45/10* (2018.01); *F21S 45/33* (2018.01); *F21S 45/50* (2018.01); *F21V 31/005* (2013.01); *H05K 5/06* (2013.01); *B01D 2251/402* (2013.01); *B01D 2251/404* (2013.01); *B01D 2251/60* (2013.01); *B01D 2251/602* (2013.01); *B01D 2253/106* (2013.01); *B01D 2253/108* (2013.01); *B01D 2253/11* (2013.01); *B01D 2259/4508* (2013.01)

(56) References Cited

U.S. PATENT DOCUMENTS

| | | | | |
|---|---|---|---|---|
| 4,809,144 A | * | 2/1989 | Suzuki | F21S 45/33 362/547 |
| 5,980,074 A | * | 11/1999 | Hwang | F21S 45/33 362/547 |
| 6,883,948 B2 | * | 4/2005 | VanDuyn | F21S 45/33 362/547 |
| 7,262,388 B2 | * | 8/2007 | Moreth | B60Q 1/0005 219/220 |
| 7,883,244 B2 | * | 2/2011 | Hsu | F21V 31/03 362/267 |
| 2005/0157514 A1 | * | 7/2005 | Brinkmann | F21S 45/33 362/547 |
| 2009/0120949 A1 | | 5/2009 | Mashiko | |
| 2011/0261578 A1 | * | 10/2011 | Kudelka | F21S 45/33 362/547 |
| 2015/0070927 A1 | | 3/2015 | Kurahashi et al. | |
| 2016/0369971 A1 | * | 12/2016 | Tezuka | F21V 31/03 |

FOREIGN PATENT DOCUMENTS

| | | |
|---|---|---|
| DE | 102014010650 A1 | 8/2015 |
| EP | 1892029 A1 | 2/2008 |
| JP | H06-031130 A | 2/1994 |
| JP | H09-102204 A | 4/1997 |
| JP | 2000-237523 A | 9/2000 |
| KR | 20130093227 A | 8/2013 |
| WO | 0047932 A1 | 8/2000 |
| WO | 2015184664 A1 | 12/2015 |

OTHER PUBLICATIONS

May 21, 2019 Extended European Search Report issued in European Patent Application No. 16875580.9.

\* cited by examiner

VENTILATION AND HUMIDITY-CONDITIONING UNIT AND APPARATUS

This is a U.S. National Phase Application based on International Application No. PCT/JP2016/086885 filed Dec. 12, 2016. The application also claims priority to Japanese Patent Application No. 2015-246748 filed Dec. 17, 2015. The disclosures of the prior applications are hereby incorporated by reference herein in their entirety.

TECHNICAL FIELD

The present invention relates to a ventilation and humidity-conditioning unit and an apparatus.

BACKGROUND ART

Conventionally, some lighting apparatuses such as a vehicle lamp or optical apparatuses such as a surveillance camera are provided with a ventilation member for providing ventilation to the housing, in order to prevent deformation or breakage of the housing due to difference in pressure between the inside and the outside of the housing. When the housing is provided with the ventilation member, water vapor and the like may enter the housing through the ventilation member, which may lead to problems such as dew condensation inside the housing and fogging of a lens.

In view of the above, Patent Document 1 discloses a technique of filling the inside of a housing with a moisture absorbent such as silica gel to prevent fogging of a lens of an automobile lamp.

CITATION LIST

Patent Literature

Patent Document 1: Japanese Patent Application Laid-Open Publication No. 9-102204

SUMMARY OF INVENTION

Technical Problem

By the way, when the humidity-conditioning member is placed inside the housing of an apparatus such as a vehicle lamp to control the humidity of the housing, it is difficult to remove the humidity-conditioning member from the housing, and in many cases replacement and the like of the humidity-conditioning member is not readily performable. Also, when the humidity-conditioning member is placed inside the housing of an apparatus, a ventilation member for providing ventilation between the inside and the outside of the housing needs to be mounted on the apparatus separately from the humidity-conditioning member, and this is likely to complicate the mounting of the ventilation member and the humidity-conditioning member on the apparatus.

An object of the present invention is to provide both of the ventilation function of providing ventilation between the inside and the outside of the housing and the function of controlling humidity of the housing by mounting on the housing.

Solution to Problem

With this object in view, the present invention is a ventilation and humidity-conditioning unit (10) including: a structure (13) mounted on a housing (2, 3) including a space inside (S1) the housing (2, 3), the structure (13) including a ventilation hole (130) providing ventilation between an inside (S1) of the housing (2, 3) and an outside (S2) of the housing (2, 3); a humidity-conditioning member (12) provided midway in the ventilation hole (130) of the structure (13), the humidity-conditioning member (12) absorbing water vapor; and a ventilation member (11) provided to the structure (13), the ventilation member (11) being closer to the outside (S2) of the housing (2, 3) than the humidity-conditioning member (12) is, the ventilation member (11) being permeable to a gas, the ventilation member (11) preventing a liquid and a solid from entering the inside (S1) of the housing (2, 3).

Here, the humidity-conditioning member (12) may absorb water vapor under an environment where a surrounding relative humidity is high and release water vapor under an environment where a surrounding relative humidity is low, and may control a humidity of the inside (S1) of the housing (2, 3).

Further, the humidity-conditioning member (12) and the ventilation member (11) may not be adhered to each other.

In another aspect, the present invention is an apparatus (1) including: a dehumidifying target (4); a housing (2, 3) accommodating the dehumidifying target (4); a structure (13) engaged with the housing (2, 3), the structure (13) including a ventilation hole (130) that provides ventilation between an inside (S1) of the housing (2, 3) and an outside (S2) of the housing (2, 3); a humidity-conditioning member (12) provided midway in the ventilation hole (130) of the structure (13), the humidity-conditioning member (12) absorbing water vapor; and a ventilation member (11) provided to the structure (13), the ventilation member (11) being closer to the outside (S2) of the housing (2, 3) than the humidity-conditioning member (12) is, the ventilation member (11) being permeable to a gas, the ventilation member (11) preventing a liquid and a solid from entering the inside (S1) of the housing (2, 3).

Here, a weight Wa of the humidity-conditioning member (12) may satisfy the following formula (1)

$$Wa \geq (V/A)/416 \tag{1}$$

where A is a maximum moisture absorption rate (%) of the humidity-conditioning member (12), and V is a volume ($cm^3$) of the housing (2, 3).

Further, the humidity-conditioning member (12) may absorb water vapor under an environment where a surrounding relative humidity is high and releases water vapor under an environment where a surrounding relative humidity is low, and the structure (13) may be engaged with the housing (2, 3) such that the ventilation member (11) is located above the humidity-conditioning member (12) in a vertical direction.

Note that the above reference signs in this section are added as examples for explaining the present invention and the present invention is not limited by these reference signs.

Advantageous Effects of Invention

According to the present invention, it is possible to provide both of the ventilation function of providing ventilation between the inside and the outside of the housing and the function of controlling humidity of the housing by mounting on the housing.

DESCRIPTION OF EMBODIMENTS

Hereinafter, an embodiment of the present invention will be described in detail with reference to the attached drawings.

[Overall Configuration of Vehicle Lamp]

Figure 1:
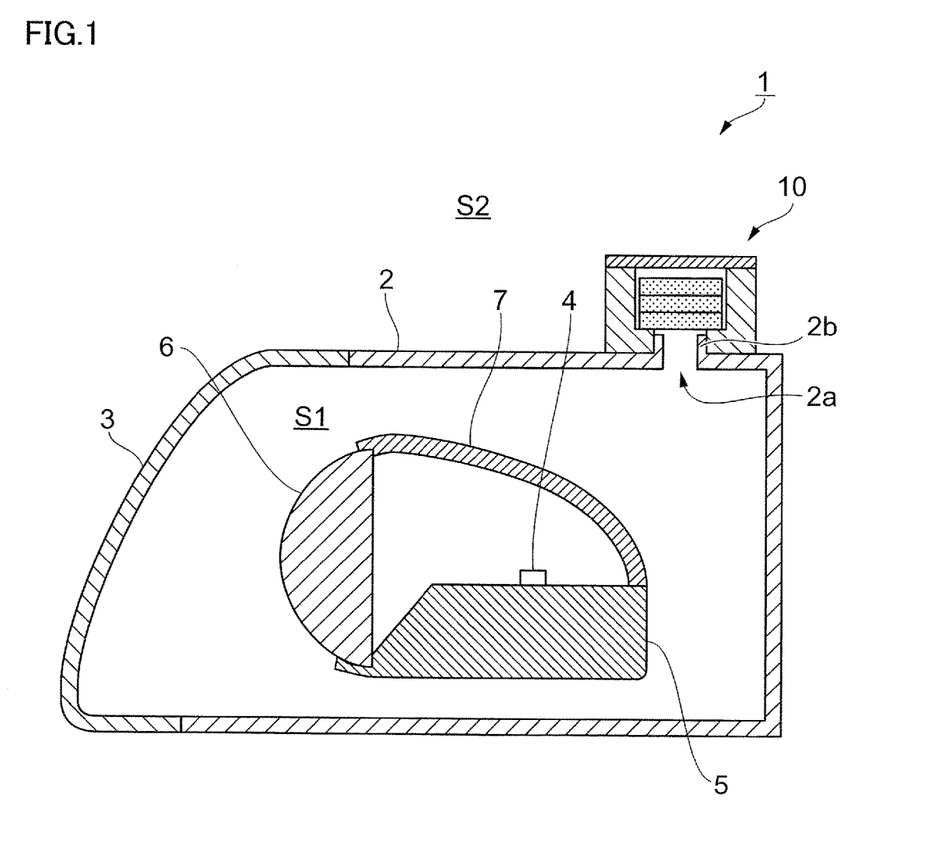
FIG. 1 is a diagram illustrating an overall configuration of a vehicle lamp according to a present embodiment.

FIG. 1 is a diagram illustrating an overall configuration of a vehicle lamp 1 according to the present embodiment.

The vehicle lamp 1 according to the present embodiment is, for example, used as a head lamp, a rear lamp, a brake lamp, a fog lamp, a turn signal lamp, a running lamp, a parking lamp and the like of various kinds of vehicles represented by automobiles. FIG. 1 illustrates a head lamp as an example of these lamps. FIG. 1 is a cross-sectional view of the vehicle lamp 1 taken along a traveling direction of the vehicle. In FIG. 1, the left side in the figure corresponds to a front side of the vehicle and the right side in the figure corresponds to a rear side of the vehicle.

The vehicle lamp 1 shown in FIG. 1 includes a case 2 that accommodates and protects components such as an LED 4 (described later), and a cover lens 3 that is mounted on the case 2 and allows the light from the LED 4 to be emitted to the outside of the vehicle lamp 1. In the vehicle lamp 1, an internal space S1 is formed by the case 2 and the cover lens 3. The internal space S1 is separated from an external space S2 of the vehicle lamp 1. This increases water-proofness and dust-proofness of the components accommodated in the case 2. In the present embodiment, the case 2 and the cover lens 3 constitute a housing of the vehicle lamp 1.

Further, the vehicle lamp 1 includes a ventilation and humidity-conditioning unit 10 that provides ventilation between the internal space S1 and the external space S2 and controls the humidity of the internal space S1.

The case 2 includes an opening 2a opened from the internal space S1 toward the external space S2. Specifically, the opening 2a is formed at a position in an upper part of the case 2 in a vertical direction and on the rear side of the vehicle. In the present embodiment, the opening 2a is formed by a cylindrical protrusion 2b protruding from the case 2 toward the external space S2.

In the vehicle lamp 1 of the present embodiment, the opening 2a of the case 2 is mounted with the ventilation and humidity-conditioning unit 10.

The vehicle lamp 1 further includes the LED (light emitting diode) 4 that is an example of the dehumidifying target and emits light, and a supporting member 5 that supports the LED 4 and dissipates heat generated in the LED 4. The vehicle lamp 1 further includes a projection lens 6 that projects the light emitted from the LED 4 forward, and a reflection mirror 7 that reflects the light emitted from the LED 4 toward the projection lens 6.

[Configuration of Ventilation and Humidity-Conditioning Unit]

Figure 2A:
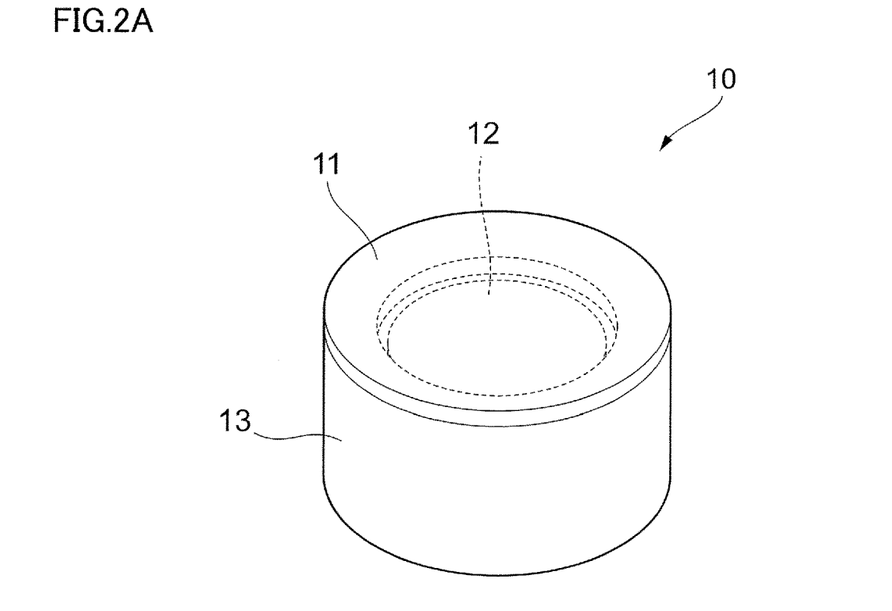
FIGS. 2A and 2B are diagrams for explaining a configuration of a ventilation and humidity-conditioning unit according to the present embodiment.
Figure 2B:
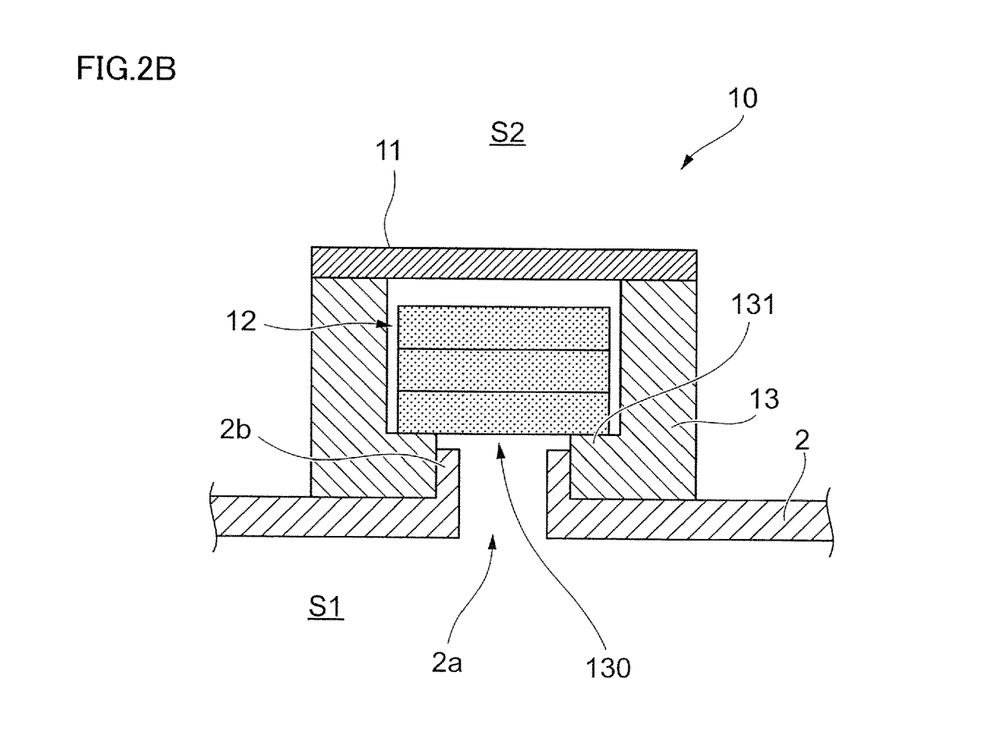

Then, the ventilation and humidity-conditioning unit 10 of the present embodiment will be explained. FIGS. 2A and 2B are diagrams for explaining a configuration of the ventilation and humidity-conditioning unit according to the present embodiment. FIG. 2A is a perspective view of the ventilation and humidity-conditioning unit 10 as viewed from obliquely above. FIG. 2B is a cross-sectional view of the ventilation and humidity-conditioning unit 10 when mounted to the opening 2a (protrusion 2b) of the vehicle lamp 1 (see FIG. 1), taken along a ventilation direction of the ventilation and humidity-conditioning unit 10.

As shown in FIGS. 2A and 2B, the ventilation and humidity-conditioning unit 10 of the present embodiment includes a ventilation filter 11 as an example of the ventilation member that provides ventilation between the internal space S1 and the external space S2 and prevents a sold and a liquid from entering the internal space S. The ventilation and humidity-conditioning unit 10 further includes a humidity-conditioning member 12 that controls the humidity of the internal space 81 by absorbing or releasing water vapor. The ventilation and humidity-conditioning unit 10 further includes a holding member 13 as an example of the structure that holds the ventilation filter 11 and the humidity-conditioning member 12 and is fitted to the opening 2a (protrusion 2b) of the case 2.

The ventilation filter 11 is a filter that prevents a liquid such as water and a solid such as dust from entering the internal space S1 and allows a gas such as air and water vapor to pass through the ventilation filter 11. For example, the ventilation filter 11 may be formed of a porous film having plural holes manufactured by a stretching method, an extraction method or the like. Examples of the porous film used as the ventilation filter 11 include a polytetrafluoroethylene (PTFE) porous film. The PTFE porous film is preferable in that it can maintain a ventilation property even with a small area and is highly capable of preventing water and dust from passing through the film.

When a porous film is used as the ventilation filter 11 of the present embodiment, an average hole diameter of the holes formed in the porous film is typically in the range from not less than 0.01 m to not more than 100 μm, preferably in the range from not less than 0.1 m to not more than 50 μm, and more preferably in the range from not less than 0.5 m to not more than 10 μm. The average hole diameter of the porous film can be measured by a mercury penetration method, for example.

If the average hole diameter of the porous film used as the ventilation filter 11 is less than 0.01 μm, a gas hardly passes through the ventilation filter 11. In this case, for example, when a temperature of the internal space S1 becomes high for reasons such as heat generation of the LED 4 and causes the air inside the internal space S1 to expand, it becomes difficult to quickly discharge the air from the internal space S1 to the external space S2. On the other hand, if the average hole diameter of the porous film used as the ventilation filter 11 is more than 100 μm, dust and the like easily pass through the ventilation filter 11. In this case, dust and the like may easily attach to the humidity-conditioning member 12 and may easily enter the internal space S1.

The surface (of a side facing the external space S2 in particular) of the ventilation filter 11 is preferably applied with a liquid-repellent treatment such as a water-repellent treatment and an oil-repellent treatment. Applying a liquid-repellent treatment to the ventilation filter 11 prevents dirt and the like from attaching to the ventilation filter 11. As a result, this prevents clogging of the ventilation filter 11, which in turn prevents deterioration in the ventilating property of the ventilation and humidity-conditioning unit 10.

For example, a liquid-repellent treatment to the ventilation filter 11 may be performed by applying, to the surface of the ventilation filter 11, a liquid-repellent agent composed of a compound having a hydrocarbon group (perfluoroalkyl group) saturated with fluorine in a side chain and having a main chain of acrylic, methacrylic, silicone or other nature. The method for applying a liquid-repellent agent to the surface of the ventilation filter 11 is not particularly limited; for example, gravure coating, spray coating, kiss coating or dipping may be used.

The humidity-conditioning member 12 of the present embodiment is made of a moisture absorbing and releasing material that has a property of absorbing water vapor under an environment where a surrounding relative humidity is high and releasing water vapor under an environment where a surrounding relative humidity is low (hereinafter this property may be simply referred to as a moisture absorbing and releasing property). Note that the humidity-conditioning member 12 allows a gas such as unabsorbed water vapor and air to flow therethrough. Here, the relative humidity at which the humidity-conditioning member 12 absorbs water vapor and the relative humidity at which the humidity-conditioning member 12 releases water vapor vary depending on a surrounding temperature, a kind of the humidity-conditioning member 12, an amount of water vapor adsorbed by the humidity-conditioning member 12 and the like. In the explanation of the present embodiment, the environment where the humidity-conditioning member 12 absorbs water vapor corresponds to the "environment where a surrounding relative humidity is high", and the environment where the humidity-conditioning member 12 releases water vapor corresponds to the "environment where a surrounding relative humidity is low".

Materials for the humidity-conditioning member 12 of the present embodiment are largely classified into inorganic moisture absorbing and releasing materials and organic moisture absorbing and releasing materials. Any of these two kinds of materials may be used as long as it ensures the moisture absorbing and releasing property of the humidity-conditioning member 12, and these two kinds of materials may be combined.

Examples of inorganic moisture absorbing and releasing materials used as the humidity-conditioning member 12 include silica gel, zeolite, clay-based materials, quicklime, calcium chloride and magnesium chloride. Any of these materials may be used alone or combined with any other of these materials.

Examples of organic moisture absorbing and releasing materials used as the humidity-conditioning member 12 include resin, fiber, woven fabric and nonwoven fabric subjected to a moisture absorbing and releasing treatment. More specifically, examples of organic moisture absorbing and releasing materials used as the humidity-conditioning member 12 include: crosslinked acrylate-based fiber, woven fabric and nonwoven fabric; fiber, woven fabric and nonwoven fabric obtained by hydrolyzing a surface of acrylic fiber in a post process; fiber, woven fabric and nonwoven fabric introduced by graft-polymerizing fiber such as polyolefin and polyester with a hydrophilic group such as a carboxyl group, a sulfonate group, a quaternary ammonium group and a salt thereof; and strong/weak acidic or strong/weak basic ion exchange resin, fiber, woven fabric and nonwoven fabric. Any of these materials may be used alone or combined with any other of these materials.

Among these materials, sheet-like fabric, nonwoven fabric and the like is preferably used in terms of allowing for easier mounting to the holding member 13 and easier control of the moisture absorbing and releasing property of the ventilation and humidity-conditioning unit 10 and in terms of allowing the ventilation and humidity-conditioning unit 10 to be smaller and lighter. Further, a moisture absorbing and releasing material having a heat resistance is preferably used as the humidity-conditioning member 12 because the ventilation and humidity-conditioning unit 10 may be placed under a high temperature environment for a long time when the ventilation and humidity-conditioning unit 10 is used for the vehicle lamp 1.

Further, the humidity-conditioning member 12 used in the present embodiment preferably has a maximum moisture absorption rate of 60% or more. In the present embodiment, the maximum moisture absorption rate refers to a ratio of Wb to Wa where Wb is a saturated weight of water absorbed by the humidity-conditioning member 12 at the temperature of 23 C° and the relative humidity of 95%, and Wa is a weight of the humidity-conditioning member 12 in a dried state (the maximum moisture absorption rate A=(Wb/Wa)×100(%)).

With a higher maximum moisture absorption rate of the humidity-conditioning member 12, the weight and volume of the humidity-conditioning member 12 provided to the ventilation and humidity-conditioning unit 10 can be smaller, preventing an increase in size of the ventilation and humidity-conditioning unit 10. Also, with a higher maximum moisture absorption rate of the humidity-conditioning member 12, the humidity of the internal space S1 of the vehicle lamp 1 can be more quickly reduced, preventing dew condensation and fogging on the cover lens 3 of the vehicle lamp 1.

The maximum moisture absorption rate of the humidity-conditioning member 12 varies depending on the kind of the moisture absorbing and releasing material used as the humidity-conditioning member 12. Also, when an organic moisture absorbing and releasing material is used as the humidity-conditioning member 12, the maximum moisture absorption rate of the humidity-conditioning member 12 varies depending on the kind of moisture absorbing and releasing treatment applied to fiber, woven fabric or nonwoven fabric and the amount of treatment.

Further, the humidity-conditioning member 12 used for the vehicle lamp 1 of the present embodiment preferably has the weight Wa (g) in a dried state that satisfies the relationship of the following formula (1):

$$Wa \geq (V/A)/416 \qquad (1)$$

(where V: Volume ($cm^3$) of the vehicle lamp 1; A: maximum moisture absorption rate (%) of the humidity-conditioning member 12)

With the weight Wa (g) of the humidity-conditioning member 12 in a dried state satisfying the above formula (1), an increase in temperature of the internal space S1 of the vehicle lamp 1 is inhibited as compared with a case where the weight Wa (g) of the humidity-conditioning member 12 in a dried state does not satisfy the formula (1). Further, even when the humidity of the internal space S1 of the vehicle lamp 1 increases, the humidity of the internal space S1 is quickly reduced.

As a result, compared with a case where the weight Wa (g) of the humidity-conditioning member 12 in a dried state does not satisfy the formula (1), with the weight Wa (g) of the humidity-conditioning member 12 in a dried state satisfying the above formula (1), the humidity of the internal space S1 can be lowered, preventing dew condensation and fogging on the cover lens 3 of the vehicle lamp 1.

FIGS. 2A and 2B show a case where a sheet-like nonwoven fabric subjected to a moisture absorbing and releasing treatment is used as the humidity-conditioning member 12. More specifically, in the ventilation and humidity-conditioning unit 10 shown in FIGS. 2A and 2B, three stacked sheets of nonwoven fabric cut into a disk shape are used as the humidity-conditioning member 12. The sheets of the humidity-conditioning member 12 of the present embodiment are not adhered each another, and the humidity-conditioning member 12 is not adhered to the ventilation filter 11 and the holding member 13 either. Details of the humidity-conditioning member 12 will be described later.

The holding member 13 has a substantially cylindrical shape as a whole. The holding member 13 includes therein a columnar ventilation hole 130 through which a gas passes. When the ventilation and humidity-conditioning unit 10 is mounted on the case 2 of the vehicle lamp 1, the ventilation hole 130 extends in a vertical direction from the internal space S1 side toward the external space S2 side. At an end portion of the holding member 13 on the internal space S1 side, a circular protrusion 131 protruding inwardly to the ventilation hole 130 is formed.

The holding member 13 of the present embodiment is made of thermoplastic elastomer or thermoplastic resin, for example.

In the ventilation and humidity-conditioning unit 10 of the present embodiment, the ventilation filter 11 is attached to the holding member 13 such that the ventilation filter 11 closes an end portion of the ventilation hole 130 on the external space S2 side. The method for attaching the ventilation filter 11 to the holding member 13 is not particularly limited, and examples of the method include heat welding, ultrasonic welding and adhesion using a glue or an adhesive.

Further, in the ventilation and humidity-conditioning unit 10 of the present embodiment, the humidity-conditioning member 12 is placed on the protrusion 131 of the holding member 13 from the external space S2 side.

The humidity-conditioning member 12 is thereby supported by the holding member 13. In the ventilation and humidity-conditioning unit 10 of the present embodiment, although the humidity-conditioning member 12 is in contact with the holding member 13, the humidity-conditioning member 12 is not adhered to the holding member 13 and the ventilation filter 11. In the present embodiment, the state where the humidity-conditioning member 12 is adhered refers to the state where the humidity-conditioning member 12 is unable to perform its moisture absorbing and releasing function for reasons such as adhesion of a glue or an adhesive to the surface of the humidity-conditioning member 12 and denaturation of the surface of the humidity-conditioning member 12 due to melting or fusion.

As described above, in the ventilation and humidity-conditioning unit of the present embodiment, the humidity-conditioning member 12 is arranged midway in the ventilation path in the ventilation hole 130 extending from the internal space S1 side toward the external space S2 side, and the ventilation filter 11 is provided closer to the external space S2 than the humidity-conditioning member 12. This prevents the humidity-conditioning member 12 from exposing to the external space S2. As a result, liquid water, dust and the like are prevented from attaching to the humidity-conditioning member 12, and this prevents deterioration in the moisture absorbing and releasing property of the humidity-conditioning member 12.

The ventilation and humidity-conditioning unit 10 of the present embodiment is mounted on the vehicle lamp 1 (see FIG. 1) with the holding member 13 being fitted to the opening 2a (the protrusion 2b) of the case 2. Specifically, the holding member 13 allows the protrusion 2b of the vehicle lamp 1 to be inserted into the end portion of the ventilation hole 130 on the internal space S1 side, and thereby the ventilation and humidity-conditioning unit 10 of the present embodiment is mounted on the vehicle lamp 1.

In this way, in the present embodiment, the ventilation filter 11 and the humidity-conditioning member 12 is mounted on the vehicle lamp 1 with an easy operation of inserting the protrusion 2b into the ventilation hole 130 of the holding member 13. In other words, in the present embodiment, the ventilation filter 11 and the humidity-conditioning member 12 is easily mounted on the vehicle lamp 1 as compared with the case where the ventilation filter 11 and the humidity-conditioning member 12 is separately provided to the housing 2.

The ventilation and humidity-conditioning unit 10 of the present embodiment is mounted on the vehicle lamp 1 from the external space S2 side of the vehicle lamp 1. This allows to easily remove the ventilation and humidity-conditioning unit 10 from the vehicle lamp 1 when, for example, the ventilation filter 11 or the humidity-conditioning member 12 is replaced.

The method for mounting the ventilation and humidity-conditioning unit 10 on the vehicle lamp 1 is not particularly limited, and examples of adoptable methods include a method of threading the protrusion 2b and the holding member 13 to screw the holding member 13 into the protrusion 2b and a method of press-fitting the protrusion 2b into the ventilation hole 130 of the holding member 13.

As shown in FIG. 2B, with the ventilation and humidity-conditioning unit 10 mounted on the vehicle lamp 1 (see FIG. 1), the internal space S1 of the vehicle lamp 1 and the inside of the ventilation hole 130 in the holding member 13 of the ventilation and humidity-conditioning unit 10 form a continuous space.

Further, as shown in FIG. 2B, in the state where the ventilation and humidity-conditioning unit 10 is mounted on the vehicle lamp 1, the humidity-conditioning member 12 is located above the internal space S1 in the vertical direction, and the ventilation filter 11 is located above the humidity-conditioning member 12 in the vertical direction.

By the way, a conventional vehicle lamp 1 such as a head lamp suffers from a problem of dew condensation and fogging (a phenomenon in which the cover lens 3 becomes clouded by fine water droplets attached thereto) on the cover lens 3 that occur due to an increase in temperature of the internal space S1. The most effective way to prevent an increase in temperature of the internal space S1 of the vehicle lamp 1 is to seal the internal space S1 of the vehicle lamp 1 by the case 2 and the cover lens 3. However, since plastics and the like composing the case 2 and the cover lens 3 have hygroscopicity, it is difficult to completely prevent water from entering the internal space S1.

Also, if the internal space S1 of the vehicle lamp 1 is sealed by the case 2 and the cover lens 3, air inside the internal space S may expand to rapidly increase the pressure of the internal space S1 or air inside the internal space S1 may shrink to rapidly decrease the pressure of the internal space S1. This may cause breakage of the case 2 or the cover lens 3.

Accordingly, to prevent a rapid change in the pressure of the internal space S1, the vehicle lamp 1 is preferably provided with a ventilation means to allow for ventilation between the internal space S1 and the external space S2.

Here, in a case where the ventilation means is provided to the vehicle lamp 1, when the humidity of the outside of the vehicle lamp 1 is high, high-humidity air containing water vapor may enter the internal space S1 through the ventilation means. Then, when the humidity of the internal space 1 increases and the temperature of the internal space 1 drops to or below a dew point, dew condensation or fogging occur on the cover lens 3.

To prevent dew condensation and fogging on the cover lens 3, it is preferable to keep the humidity of the internal space S1 low by preventing water vapor from entering the internal space S1 and, when water vapor enters the internal space S1 to increase the humidity of the internal space S1, it is preferable to quickly decrease the humidity of the internal space S1.

Accordingly, in the vehicle lamp 1 of the present embodiment, the ventilation and humidity-conditioning unit 10 not only provides ventilation between the internal space S1 and the external space S2 to eliminate the difference in pressure but also controls the humidity (performs humidity-conditioning) of the internal space S1 by adsorbing water vapor entering the internal space S1 through ventilation.

[Operation of the Ventilation and Humidity-Conditioning Unit]

Next, a ventilation operation and a humidity-conditioning operation performed by the ventilation and humidity-conditioning unit 10 of the present embodiment will be explained. In the vehicle lamp 1 of the present embodiment, the pressure of the internal space S1 may become lower than the pressure of the external space S2 for reasons such as a decrease in temperature of the internal space S1. In this case, in the ventilation and humidity-conditioning unit 10, a gas flows into the ventilation hole 130 from the external space S2 through the ventilation filter 11. As described above, since the ventilation hole 130 and the internal space S1 form a continuous space in the state where the ventilation and humidity-conditioning unit 10 is mounted on the vehicle lamp 1, this flow of the gas into the ventilation hole 130 from the external space S2 eliminates the difference in pressure between the internal space S and the external space S2.

Further, as described above, the ventilation filter 11 is composed of a filter that does not allow a liquid such as water and a solid such as dust to pass through the ventilation filter 11. Accordingly, even when the ventilation and humidity-conditioning unit 10 allows a gas to flow into the ventilation hole 130 from the external space S2, a liquid and a solid are prevented from entering the ventilation hole 130. This prevents dust and the like from attaching to the humidity-conditioning member 12, for example.

Here, when the relative humidity of the external space S2 is higher than the relative humidity of the ventilation hole 130 or the internal space S1, a high-humidity gas (water vapor) flows into the ventilation hole 130 from the external space S2 through the ventilation filter 11.

As described above, the ventilation hole 130 is provided with the humidity-conditioning member 12. The humidity-conditioning member 12 has a property of absorbing water vapor under an environment where the relative humidity is high. Accordingly, when water vapor flows into the ventilation hole 130 from the external space S2 through the ventilation filter 11, the water vapor is adsorbed by the humidity-conditioning member 12. As a result, a gas with a reduced humidity, which is due to the water vapor being adsorbed by the humidity-conditioning member 12, flows into the internal space S1 from the ventilation hole 130. This prevents an increase in humidity of the internal space S, as compared to the case where water vapor is not adsorbed by the humidity-conditioning member 12.

Further, for example when the difference in pressure between the internal space S1 and the external space S2 is large and a gas flows from the external space S2 at a fast flow rate, the humidity-conditioning member 12 may not fully adsorb water vapor and may let some of the water vapor enter the internal space S1, and the humidity of the internal space S1 may increase as a result. In this case, the water vapor flowing into the internal space S1 contacts the humidity-conditioning member 12 through the ventilation hole 130 and is adsorbed by the humidity-conditioning member 12. This decreases the humidity of the internal space S1.

In this way, in the vehicle lamp 1 of the present embodiment, the ventilation and humidity-conditioning unit 10 prevents water vapor from entering the internal space S1 and, when the humidity of the internal space S1 has increased, the ventilation and humidity-conditioning unit 10 decreases the humidity of the internal space S1. This prevents water vapor from attaching to the cover lens 3 to become water droplets, and thereby prevents dew condensation and fogging on the cover lens 3.

Further, as described above, the humidity-conditioning member 12 has a property of releasing adsorbed water vapor under an environment where the relative humidity is low. Accordingly, for example when the humidity of the external space S2 has decreased, the humidity-conditioning member 12 releases water vapor to restore its ability to adsorb water vapor.

Here, since the density of water vapor is smaller than that of air, water vapor released from the humidity-conditioning member 12 generally rises upward in the vertical direction. As described above, in the state where the ventilation and humidity-conditioning unit 10 of the present embodiment is mounted on the vehicle lamp 1, the ventilation filter 11 is located above the humidity-conditioning member 12 in the vertical direction. This allows water vapor released from the humidity-conditioning member 12 to rise upward in the vertical direction and pass through the ventilation filter 11 to be released to the external space S2.

Further, as described above, the humidity-conditioning member 12 is located above the internal space S1 of the vehicle lamp 1 in the vertical direction. This prevents water vapor released from the humidity-conditioning member 12 from moving to the internal space S1, and thereby prevents an increase in humidity of the internal space S1 due to water vapor released from the humidity-conditioning member 12.

Further, as described above, in the ventilation and humidity-conditioning unit 10 of the present embodiment, the humidity-conditioning member 12 is not adhered to the ventilation filter 11 and the holding member 13. This increases a surface area of the humidity-conditioning member 12 contacting a gas moving in the ventilation hole 130 as compared to, for example, the case where the humidity-conditioning member 12 is adhered to the ventilation filter 11 or the holding member 13.

With this configuration, the ventilation and humidity-conditioning unit 10 of the present embodiment increases the ability of the humidity-conditioning member 12 to adsorb water vapor as compared to the case where the humidity-conditioning member 12 is adhered to the ventilation filter 11 or the holding member 13, thereby preventing an increase in humidity of the internal space S1. Also, when the humidity of the external space S1 has decreased, the humidity-conditioning member 12 more easily releases water vapor and quickly restores its ability to adsorb water vapor.

Further, in the present embodiment, the ventilation filter 11 for providing ventilation between the internal space S and the external space S2 and the humidity-conditioning member 12 for performing humidity-conditioning of the internal space S1 are integrated by the holding member 13 in the ventilation and humidity-conditioning unit 10. This simplifies the configuration of the vehicle lamp 1 as compared to, for example, the case where a member for providing ventilation between the internal space S1 and the external space S2 and a member for performing humidity-conditioning of the internal space S1 are separately provided in the vehicle lamp 1.

Figure 3A:
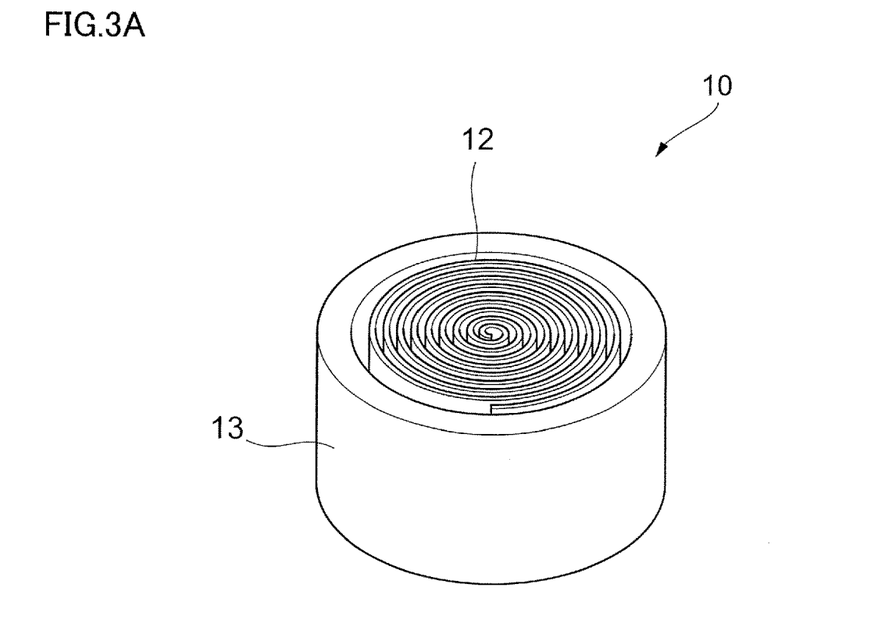
FIGS. 3A and 3B are diagrams for explaining another example of a configuration of the ventilation and humidity-conditioning unit.
Figure 3B:
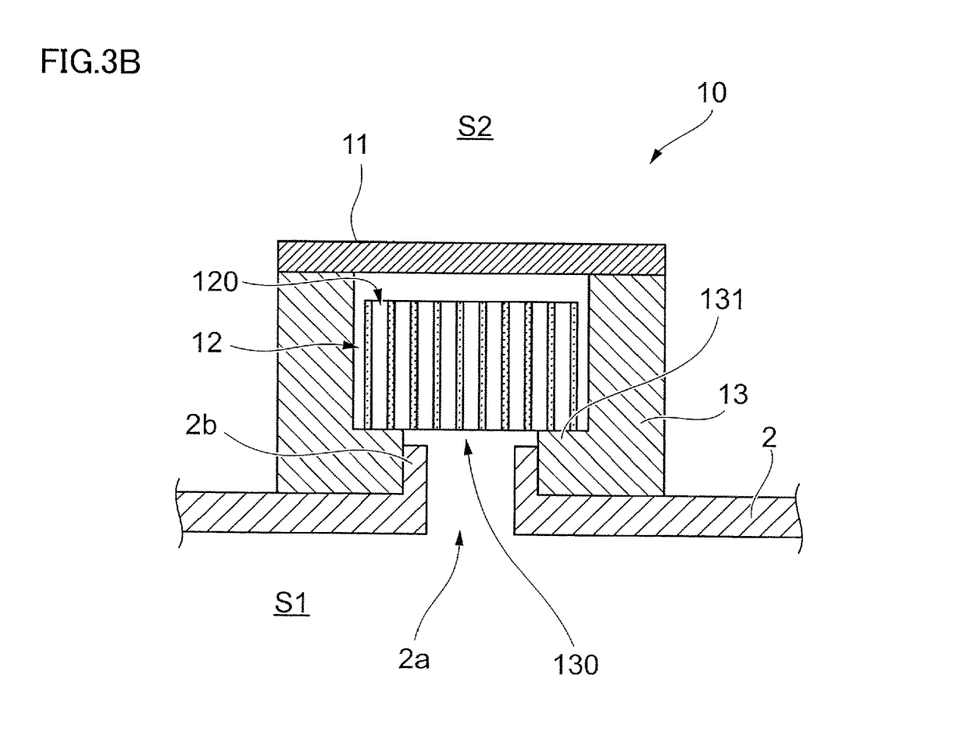

Next, another configuration example of the ventilation and humidity-conditioning unit 10 will be explained. FIGS. 3A and 3B are diagrams for illustrating another configuration example of the ventilation and humidity-conditioning unit 10. FIG. 3A is a perspective view of the ventilation and humidity-conditioning unit 10 as viewed from obliquely above. Note that the ventilation filter 11 is omitted in FIG. 3A. FIG. 3B is a cross-sectional view of the ventilation and humidity-conditioning unit 10 when fitted to the opening 2a (protrusion 2b) of the vehicle lamp 1 (see FIG. 1), taken along the ventilation direction of the ventilation and humidity-conditioning unit 10. Here, the similar components to those of the ventilation and humidity-conditioning unit 10 shown in FIGS. 2A and 2B are denoted by the same reference numerals and detailed description thereof is omitted.

In the ventilation and humidity-conditioning unit 10 shown in FIGS. 3A and 3B, a sheet-like moisture absorbing and releasing material is used as the humidity-conditioning member 12. The sheet-like moisture absorbing and releasing material is wound such that its cross-sectional shape cut in a plane perpendicular to the ventilation direction forms a spiral shape. As the sheet-like moisture absorbing and releasing material, woven fabric or nonwoven fabric as described above may be used.

By use of the humidity-conditioning member 12 made of the sheet-like moisture absorbing and releasing material wound to have the spiral cross-section, plural gaps 120 are formed in the humidity-conditioning member 12 along the ventilation direction of the ventilation and humidity-conditioning unit 10, as shown in FIG. 3B.

As a result, when the pressure of the internal space S1 becomes lower than the pressure of the external space S2, a gas flowing from the external space S2 through the ventilation filter 11 passes the gaps 120 formed in the humidity-conditioning member 12 to move to the internal space S1. At this time, the gas moving through the gaps 120 contacts the surface of the humidity-conditioning member 12. Accordingly, water vapor contained in the gas is easily adsorbed by the humidity-conditioning member 12, and this allows to more effectively prevent an increase in humidity of the internal space S1 when a high-humidity gas flows from the external space S2.

As explained above, the present embodiment provides the ventilation and humidity-conditioning unit 10 that integrates the function of providing ventilation between the internal space S1 and the external space S2 and the function of performing humidity-conditioning of the internal space S1. Thus, when the ventilation and humidity-conditioning unit 10 of the present embodiment is mounted on an apparatus such as the vehicle lamp 1, the ventilation and humidity-conditioning unit 10 prevents breakage of the case 2 or the cover lens 3 due to a difference in pressure between the internal space S1 and the external space S2, and prevents fogging and dew condensation on the cover lens 3.

Although, in the ventilation and humidity-conditioning unit 10 of the above embodiment, the ventilation filter 11 is provided on the external space S2 side with respect to the humidity-conditioning member 12, another ventilation filter may be further provided to the internal space S1 side with respect to the humidity-conditioning member 12. In other words, in the ventilation and humidity-conditioning unit 10, the ventilation filters 11 may be provided on both of the internal space S1 side and the external space S2 side with respect to the humidity-conditioning member 12 on the ventilation path connecting the internal space S1 and the external space S2.

With this configuration, two ventilation filters 11 are present on the ventilation path between the internal space S1 and the external space S2, and this allows to more effectively prevent a liquid and a solid from entering the internal space S1 when a gas flows into the internal space S1 from the external space S2.

Also, even with this configuration, water vapor flowing into the internal space S1 is adsorbed by the humidity-conditioning member 12 by passing through the ventilation filter 11 provided on the internal space S1 side. The humidity of the internal space S1 is thereby decreased as in the above embodiment.

Although the above embodiment uses the vehicle lamp 1 including the LED 4 inside the case 2 as an example of apparatuses for which the ventilation and humidity-conditioning unit 10 performs ventilation and humidity-conditioning (dehumidifying), the apparatuses to which the present invention is applicable are not limited to the vehicle lamp 1. That is, the present invention is applicable to any other apparatuses than the vehicle lamp 1 that include electronic components inside the case 2 and are prone to encounter problems of dew condensation and fogging on the cover lens 3 and an increase in humidity of the internal space S1, such as a car-mounted camera, a surveillance camera, a digital camera and an ECU (engine control unit).

Then, the function of the ventilation and humidity-conditioning unit is explained in more detail using experiment examples.

Experiment Example 1

Assuming a substantially columnar housing mounted with the ventilation and humidity-conditioning unit 10 to be the housing of the vehicle lamp 1, the humidity (relative humidity) inside the housing (the internal space S1) was measured while varying the weight of the humidity-conditioning member 12 of the ventilation and humidity-conditioning unit 10.

As the housing, one including a closed-end container with a diameter of 100 mm and a height of 65 mm and a disk-like lid portion closing a circular opening of the container and having a volume of 500 cm$^3$ was used. The lid portion of the housing was provided with an opening 2a with a diameter of 5 mm, to which the ventilation and humidity-conditioning unit having the shape shown in FIGS. 2A and 2B was fitted. A humidity sensor measuring the humidity inside the housing (the internal space S1) was installed on the container.

As the ventilation film 11 of the ventilation and humidity-conditioning unit 10, a film formed by thermally laminating a PTFE porous film with a thickness of 80 m and nonwoven fabric made from a polyethylene and polyester mixture with a basis weight of 30 g/m$^2$ was used.

As the humidity-conditioning member 12 of the ventilation and humidity-conditioning unit 10, nonwoven fabric with a basis weight of 130 g/m² and having a moisture absorbing and releasing property was used. The maximum moisture absorption rate of this humidity-conditioning member 12 was 120%. The weight of the humidity-conditioning member 12 was varied between 0 g (the ventilation filter 11 alone without the humidity-conditioning member 12), 0.005 g, 0.010 g, 0.020 g and 0.040 g.

(Measurement of Humidity)

The container and the lid portion of the housing mounted with the ventilation and humidity-conditioning unit 10 was placed at a temperature of 80 C° and a relative humidity of 5% or less for 12 hours with the lid portion opened from the container, in such a manner that the ventilation filter 11 of the ventilation and humidity-conditioning unit 10 fitted to the opening 2a of the lid portion faced upward in the vertical direction. Subsequently, the container and the lid portion were placed at a temperature of 23 C° and a relative humidity of 50% for 12 hours to make the internal environment constant. Thereafter, the lid portion was closed and a relative humidity (H1) of the internal space S1 was measured.

Then, the housing with the lid portion closed was placed in a thermohygrostat bath at a temperature of 23 C° and a relative humidity of 95% in such a manner that the ventilation filter 11 of the ventilation and humidity-conditioning unit 10 faced upward in the vertical direction, and a relative humidity (H2) of the internal space S1 after two hours was measured.

After that, the relative humidity of the thermohygrostat bath was changed to 0%, and a relative humidity (H3) of the internal space S1 after two hours (four hours after the housing was placed in the thermohygrostat bath) was measured.

(Measurement Results)

Figure 4:
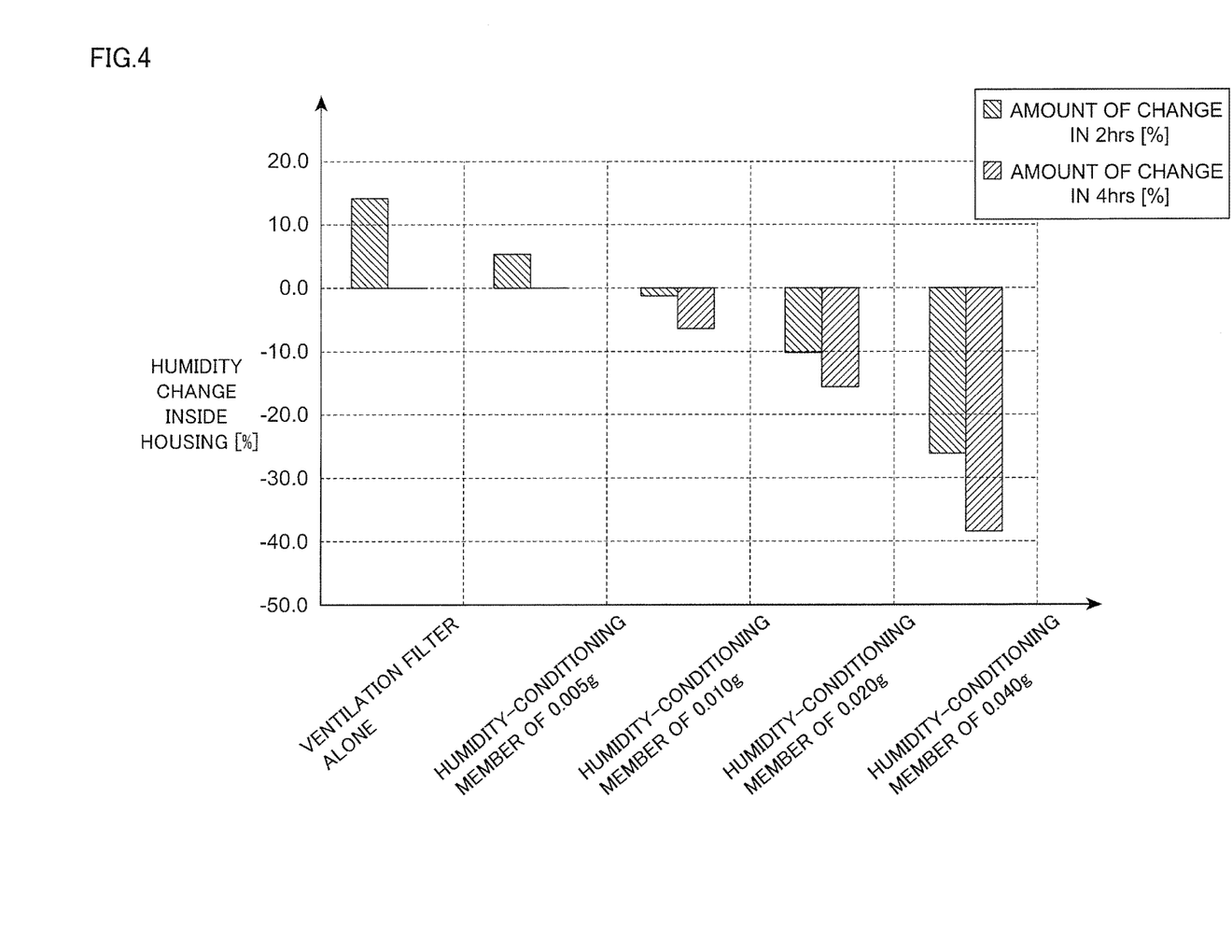
FIG. 4 is a diagram illustrating an amount of change in the humidity of an internal space at different weights of a humidity-conditioning member in Experiment Example 1.

FIG. 4 illustrates an amount of change in the humidity of the internal space S1 at different weights of the humidity-conditioning member 12 in Experiment Example 1. In FIG. 4, "Amount of change after 2 hrs (%)" indicates an amount of change in the relative humidity (%) of the internal space S1 after two hours from when the housing was placed in the thermohygrostat bath (H2–H1), and "Amount of change after 4 hrs (%)" indicates an amount of change in the relative humidity (%) of the internal space S1 after four hours (H3–H1).

As shown in FIG. 4, it was found that when the ventilation and humidity-conditioning unit 10 has the humidity-conditioning member 12 in addition to the ventilation filter 11, the humidity of the internal space S1 is decreased as compared to the case where the ventilation and humidity-conditioning unit 10 does not have the humidity-conditioning member 12 (the case where the ventilation and humidity-conditioning unit 10 only has the ventilation filter 11). In other words, it was found that the ventilation and humidity-conditioning unit 10 with the humidity-conditioning member 12 more effectively prevents water vapor from entering the internal space S1 than the ventilation and humidity-conditioning unit 10 without the humidity-conditioning member 12.

Also, as shown in FIG. 4, it was found that with a higher weight of the humidity-conditioning member 12 used in the ventilation and humidity-conditioning unit 10, the humidity of the internal space S1 becomes lower.

Further, it was found that when the weight of the humidity-conditioning member 12 satisfies the above formula (1) (the weight of the humidity-conditioning member 12 is 0.010 g, 0.020 g or 0.040 g), the effect of decreasing the humidity of the internal space S1 becomes more pronounced than in the case where the humidity-conditioning member 12 does not satisfy the formula (1) (the weight of the humidity-conditioning member 12 is 0.005 g). More specifically, even when the housing is placed in the thermohygrostat bath at a temperature of 23 C° and a relative humidity of 95%, the humidity-conditioning member 12 with the weight satisfying the above formula (1) can make the humidity of the internal space S1 lower than that before placement in the thermohygrostat bath.

Experiment Example 2

Under the same conditions as Experiment Example 1 except that the humidity-conditioning member 12 having the maximum moisture absorption rate of 60% was used, the humidity of the internal space S1 of the housing was measured.

Figure 5:
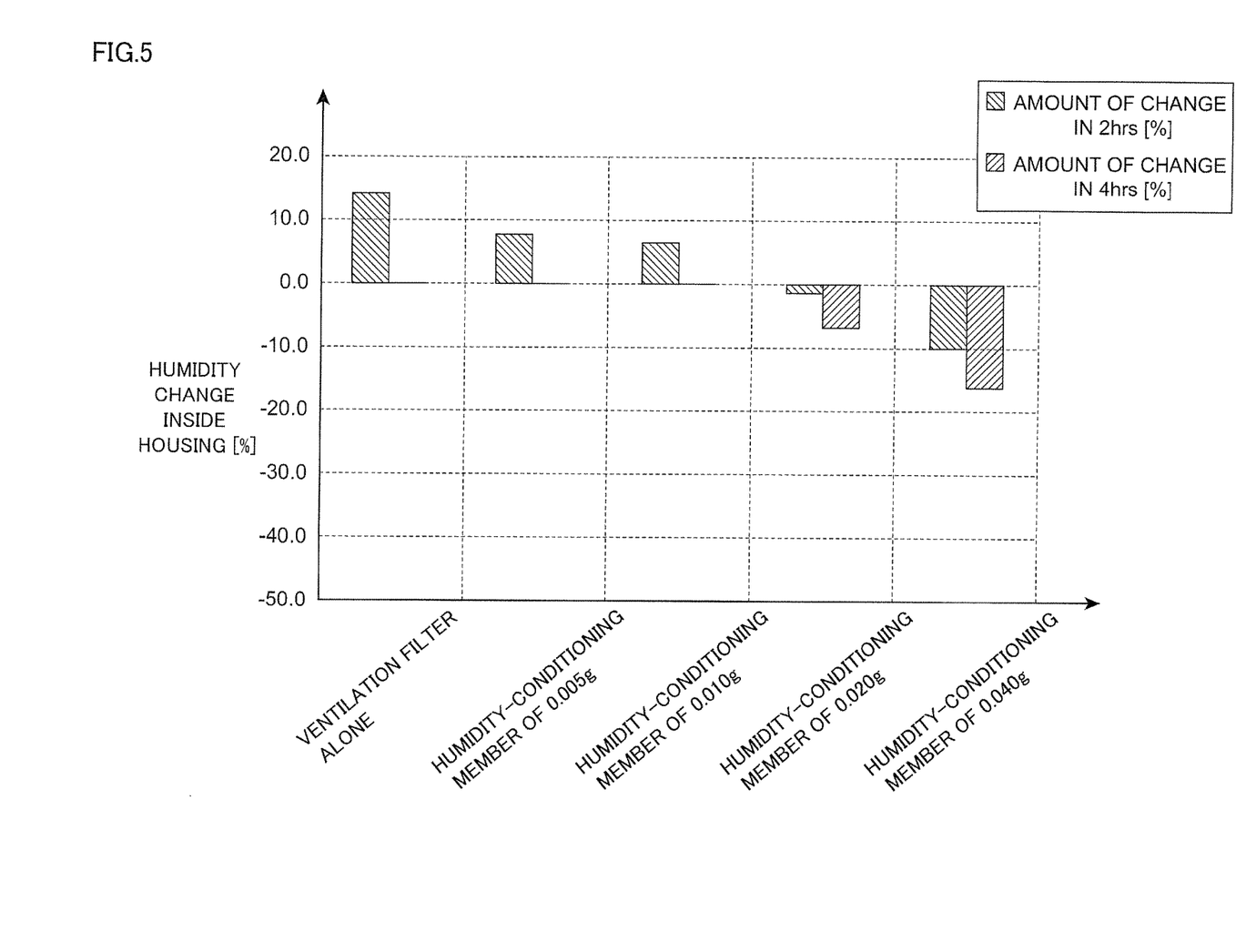
FIG. 5 is a diagram illustrating an amount of change in the humidity of the internal space at different weights of the humidity-conditioning member in Experiment Example 2.

FIG. 5 illustrates an amount of change in the humidity of the internal space S1 at different weights of the humidity-conditioning member 12 in Experiment Example 2.

As shown in FIG. 5, it was found that with the humidity-conditioning member 12 having the maximum moisture absorption rate of 60% too, the humidity of the internal space S1 becomes lower than in the case where the ventilation and humidity-conditioning unit 10 does not have the humidity-conditioning member 12, similarly to Experiment Example 1.

Further, it was found that with the humidity-conditioning member 12 having the maximum moisture absorption rate of 60% too, when the weight of the humidity-conditioning member 12 satisfies the above formula (1) (the weight of the humidity-conditioning member 12 is 0.020 g or 0.040 g), the effect of decreasing the humidity of the internal space S1 becomes more pronounced than in the case where the humidity-conditioning member 12 does not satisfy the formula (1) (the weight of the humidity-conditioning member 12 is 0.005 g or 0.010 g). More specifically, even when the housing is placed in the thermohygrostat bath at a temperature of 23 C° and a relative humidity of 95%, the humidity-conditioning member 12 with the weight satisfying the above formula (1) can make the humidity of the internal space S lower than that before placement in the thermohygrostat bath.

Comparing the results of Experiment Example 1 shown in FIG. 4 and Experiment Example 2 shown in FIG. 5, it was found that Experiment Example 1, in which the humidity-conditioning member 12 with a higher maximum moisture absorption rate was used, more effectively produces the effect of decreasing the humidity of the internal space S1 than Experiment Example 2. In other words, it was found that, when the weight of the humidity-conditioning member 12 is equal, the humidity-conditioning member 12 with a higher maximum moisture absorption rate more effectively produces the effect of decreasing the humidity of the internal space S1.

Experiment Example 3

Under the same conditions as Experiment Example 1 except that the humidity-conditioning member 12 was adhered to the ventilation filter 11 by thermal lamination, the humidity of the internal space S1 of the housing was measured.

Figure 6:
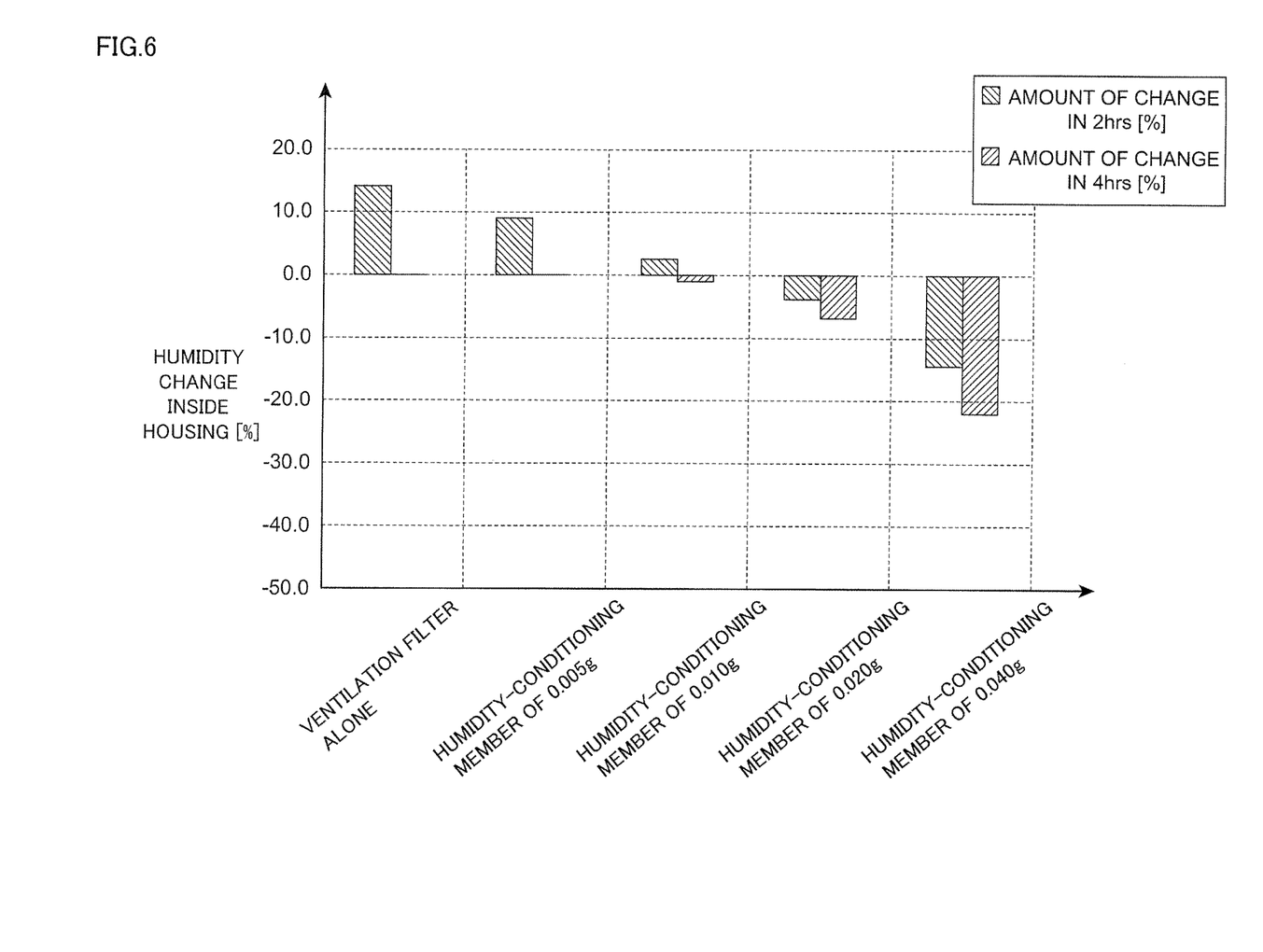
FIG. 6 is a diagram illustrating an amount of change in the humidity of the internal space at different weights of the humidity-conditioning member in Experiment Example 3.

FIG. 6 illustrates an amount of change in the humidity of the internal space S1 at different weights of the humidity-conditioning member 12 in Experiment Example 3.

As shown in FIG. 6, it was found that with the humidity-conditioning member 12 adhered to the ventilation filter 11 too, the humidity of the internal space S1 becomes lower than in the case where the ventilation and humidity-conditioning unit 10 does not have the humidity-conditioning member 12.

Comparing the results of Experiment Example 1 shown in FIG. 4 and Experiment Example 3 shown in FIG. 6, it was found that Experiment Example 1, in which the humidity-conditioning member 12 was not adhered to the ventilation filter 11, more effectively produces the effect of decreasing the humidity of the internal space S1 than Experiment Example 3, in which the humidity-conditioning member 12 was adhered to the ventilation filter 11. In other words, it was found that adhering the humidity-conditioning member 12 to the ventilation filter 11 hinders the moisture absorbing function or the moisture releasing function of the humidity-conditioning member 12 as compared to the case where the humidity-conditioning member 12 is not adhered to the ventilation filter 11.

Experiment Example 4

Under the same conditions as Experiment Example 1 except that the housing was placed in the thermohygrostat bath in such a manner that the ventilation filter 11 of the ventilation and humidity-conditioning unit 10 faced downward in the vertical direction, the humidity of the internal space S1 of the housing was measured. In other words, the humidity of the internal space S1 of the housing was measured under the same conditions as Experiment Example 1 except that the housing was placed in the thermohygrostat bath in the state where the housing was vertically reversed from the orientation in Experiment Example 1.

Figure 7:
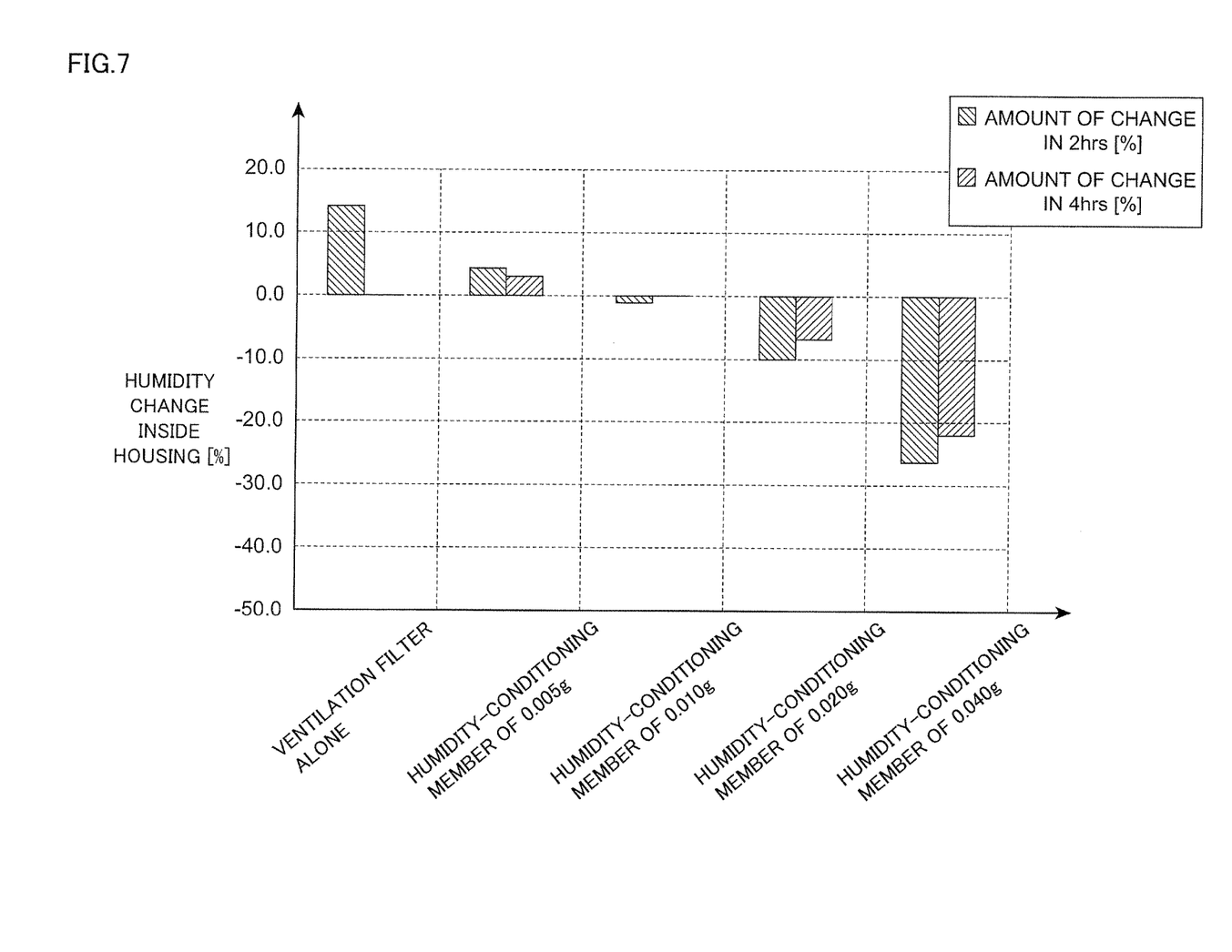
FIG. 7 is a diagram illustrating an amount of change in the humidity of the internal space at different weights of the humidity-conditioning member in Experiment Example 4.

FIG. 7 illustrates an amount of change in the humidity of the internal space S1 at different weights of the humidity-conditioning member 12 in Experiment Example 4.

As shown in FIG. 7, it was found that even when the housing is vertically reversed such that the ventilation filter 11 faces downward in the vertical direction, the ventilation and humidity-conditioning unit 10 having the humidity-conditioning member 12 can decrease the humidity of the internal space S1 as compared to the case where the ventilation and humidity-conditioning unit 10 does not have the humidity-conditioning member 12.

Also, as shown in FIG. 7, it was found that, under the conditions where the housing is placed such that the ventilation filter 11 faces downward in the vertical direction and the humidity-conditioning member 12 has the weight of 0.010 g or more, when the relative humidity of the thermohygrostat bath is changed to 0%, the humidity of the internal space S increases from the humidity before changing the relative humidity of the thermohygrostat bath. Assumedly this is because water vapor released from the humidity-conditioning member 12 moves to the internal space S1 located above the humidity-conditioning member 12 in the vertical direction.

REFERENCE SIGNS LIST

1 Vehicle lamp
2 Case
3 Cover lens
Ventilation and humidity-conditioning unit
11 Ventilation filter
12 Humidity-conditioning member
13 Holding member

The invention claimed is:

1. A ventilation and humidity-conditioning unit comprising:
   a structure mounted on a housing including a space inside the housing that is separated from an outside thereof, the structure including a ventilation hole providing ventilation between an inside of the housing and the outside of the housing;
   a humidity-conditioning member provided midway in the ventilation hole of the structure, the humidity-conditioning member absorbing water vapor; and
   a ventilation member provided to the structure, the ventilation member being closer to the outside of the housing than the humidity-conditioning member is, the ventilation member being permeable to a gas, the ventilation member preventing a liquid and a solid from entering the inside of the housing.

2. The ventilation and humidity-conditioning unit according to claim 1, wherein the humidity-conditioning member absorbs water vapor under an environment where a surrounding relative humidity is high and releases water vapor under an environment where a surrounding relative humidity is low, and controls a humidity of the inside of the housing.

3. The ventilation and humidity-conditioning unit according to claim 1, wherein the humidity-conditioning member and the ventilation member are not adhered to each other.

4. The ventilation and humidity-conditioning unit according to claim 1, wherein the humidity-conditioning member is free-floating between the ventilation member and the ventilation hole of the structure.

5. An apparatus comprising:
   a dehumidifying target;
   a housing accommodating the dehumidifying target that is separated from an outside thereof;
   a structure engaged with the housing, the structure including a ventilation hole that provides ventilation between an inside of the housing and the outside of the housing;
   a humidity-conditioning member provided midway in the ventilation hole of the structure, the humidity-conditioning member absorbing water vapor; and
   a ventilation member provided to the structure, the ventilation member being closer to the outside of the housing than the humidity-conditioning member is, the ventilation member being permeable to a gas, the ventilation member preventing a liquid and a solid from entering the inside of the housing.

6. The apparatus according to claim 5, wherein a weight Wa of the humidity-conditioning member satisfies the following formula (1)

$$Wa \geq (V/A)/416 \qquad (1)$$

where A is a maximum moisture absorption rate (%) of the humidity-conditioning member, and V is a volume ($cm^3$) of the housing.

7. The apparatus according to claim 5, wherein the humidity-conditioning member absorbs water vapor under an environment where a surrounding relative humidity is high and releases water vapor under an environment where a surrounding relative humidity is low, and
   the structure is engaged with the housing such that the ventilation member is located above the humidity-conditioning member in a vertical direction.

8. The apparatus according to claim 5, wherein the humidity-conditioning member is free-floating between the ventilation member and the ventilation hole of the structure.

* * * * *